US007324914B2

(12) United States Patent
Jain et al.

(10) Patent No.: US 7,324,914 B2
(45) Date of Patent: Jan. 29, 2008

(54) TIMING CLOSURE FOR SYSTEM ON A CHIP USING VOLTAGE DROP BASED STANDARD DELAY FORMATS

(75) Inventors: Atul K. Jain, Dallas, TX (US); Venugopal Puvvada, Bangalore (IN); Jayashree Saxena, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 114 days.

(21) Appl. No.: 10/977,031

(22) Filed: Oct. 29, 2004

(65) Prior Publication Data

US 2006/0106564 A1    May 18, 2006

(51) Int. Cl.
*G06F 19/00*   (2006.01)
*G06F 9/45*    (2006.01)

(52) U.S. Cl. .......................................... 702/125; 716/6
(58) Field of Classification Search ................ 702/125, 702/64, 120, 182; 716/1, 6; 713/340; 703/19
See application file for complete search history.

(56) References Cited

U.S. PATENT DOCUMENTS

| | | | | |
|---|---|---|---|---|
| 6,453,443 B1* | 9/2002 | Chen et al. | ..................... | 716/1 |
| 6,519,748 B2* | 2/2003 | Sakamoto | ....................... | 716/6 |
| 6,523,154 B2* | 2/2003 | Cohn et al. | ..................... | 716/6 |
| 6,629,298 B1* | 9/2003 | Camporese et al. | ........... | 716/6 |
| 6,832,361 B2* | 12/2004 | Cohn et al. | ..................... | 716/6 |
| 6,940,293 B2* | 9/2005 | Ramarao et al. | ............ | 324/677 |
| 6,971,079 B2* | 11/2005 | Yee et al. | ....................... | 716/6 |
| 2002/0112212 A1* | 8/2002 | Cohn et al. | .................... | 716/1 |
| 2004/0243952 A1* | 12/2004 | Croix | ............................ | 716/4 |
| 2004/0249588 A1* | 12/2004 | Shimazaki et al. | ........... | 702/66 |
| 2005/0257077 A1* | 11/2005 | Dutta et al. | ................. | 713/340 |
| 2006/0064659 A1* | 3/2006 | Ushiyama et al. | ............. | 716/6 |

OTHER PUBLICATIONS

Kokrady et al., Static Verification of Test Vectors for IR Drop Failure, Nov. 11-13, 2003, ICCAD '03, pp. 760-764.*
Saxena et al., A Case Study of IR-Drop in Structured At-Speed Testing, Sep. 30-Oct. 2, 2003, Proceedings ITC 2003 International, vol. 1, pp. 1098-1104.*

* cited by examiner

*Primary Examiner*—Michael Nghiem
*Assistant Examiner*—Toan M. Le
(74) *Attorney, Agent, or Firm*—Steven A. Shaw; W. James Brady; Frederick J. Telecky, Jr.

(57) ABSTRACT

A timing closure analysis associated with SoCs uses voltage drop based standard delay formats (SDFs). Static timing analysis (STA) is implemented using multiple SDFs, one for each mode (ATPG Test, BIST Test, Functional) as contrasted with doing STA with only one worst-case SDF for all modes. The multiple SDFs account for the impact of dynamic voltage drops on delays in addition to static IR drops.

10 Claims, 2 Drawing Sheets

TIMING CLOSURE FOR SYSTEM ON A CHIP USING VOLTAGE DROP BASED STANDARD DELAY FORMATS

BACKGROUND OF THE INVENTION

1. Field of the Invention

This invention relates generally to timing analysis techniques, and more particularly to a method, of implementing static timing analysis associated with System-on-chips (SoCs).

2. Description of the Prior Art

Today's SoCs consist of several million gates of equivalent logic and memory running at high clock frequencies. This results in considerable voltage drop from periphery to the center of the chip for wire bond designs for both functional (or "mission mode") and test modes. These voltage drops are seen to be worse in the case of test modes, as almost all the flops are switching simultaneously. Techniques have been devised to minimize voltage drop in the test mode. Such methods however, generally increase test time which adversely impacts the bottom line.

At present, to compensate for voltage drop, designs are built with margins for timing closure. Each static timing analysis (STA) run is typically done at a PVT (process, voltage, temperature) corner using flat timing margins. This technique results in extra gates on the die. Further, a question remains as to whether enough margin exists to compensate for the voltage drop. Voltage drop is becoming more critical for timing analysis with decreasing core voltages and increasing clock frequencies associated with modern products and applications. Further, voltage drops are not necessarily identical for functional and test modes. Design margins therefore, must comprehend the worst case scenario.

IR drop analysis today is pessimistic, which results in additional margins that increase cycle times for timing closure and potentially increases die size. Further, today's design flow does not comprehend dynamic voltage drop.

In view of the foregoing, it would be highly desirable and advantageous to provide a timing closure analysis technique for SoCs that uses a more realistic scenario by accounting for impact of both dynamic/static voltage drops on delays and not just rely on static IR drops.

SUMMARY OF THE INVENTION

The present invention is directed to timing closure analysis techniques associated with SoCs using voltage drop based standard delay formats (SDFs). Static timing analysis (STA) is done using multiple SDFs, one for each mode (ATPG (automatic test pattern generation), BIST (built-in self-test), Functional) as contrasted with running STA with only one worst-case SDF for all modes. The multiple SDFs account for the impact of dynamic voltage drops on delays in addition to static IR drops.

A user of the technique using voltage drop based standard delay formats will be required to provide toggle activity for the system-on-a-chip (SoC) in different modes. Static voltage drop value needs to be generated for each instance using IR drop analysis tools for each mode of operation. The maximum dynamic voltage drop (Ldi/dt+i(t)R) value is added to get the total voltage drop at each instance in the design.

Cell delays are generated using the corresponding instance voltage instead of using a fixed voltage for a PVT corner. Interconnect delays are computed based on the instance specific voltage of the driving cell. The proposed flow will dump SDFs that comprehend voltage drop across die for both cell and interconnect delays.

According to one embodiment, a method of implementing static timing analysis of system on a chip (SoC) devices comprises the steps of: generating a plurality of voltage-drop based standard delay formats (SDFs) each associated with a SoC operational mode, selected from the group consisting of ATPG Test, BIST Test, and Functional; toggling between ATPG Test, BIST Test and Functional modes to select a desired operational mode; and running static timing analysis for the desired operational mode using its respective voltage-drop based SDF.

According to another embodiment, a method of system-on-a-chip (SoC) static timing analysis comprises toggling between a plurality of voltage-drop based standard delay formats (SDFs) associated with SoC operational modes selected from the group consisting of ATPG Test, BIST Test, and Functional, and generating a static timing analysis for each toggled operational mode using its respective voltage-drop based SDF.

The proposed technique will enable less pessimistic timing analysis and rely less on margins to close timings for SoCs.

BRIEF DESCRIPTION OF THE DRAWINGS

Other aspects and features of the present invention and many of the attendant advantages of the present invention will be readily appreciated as the invention becomes better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
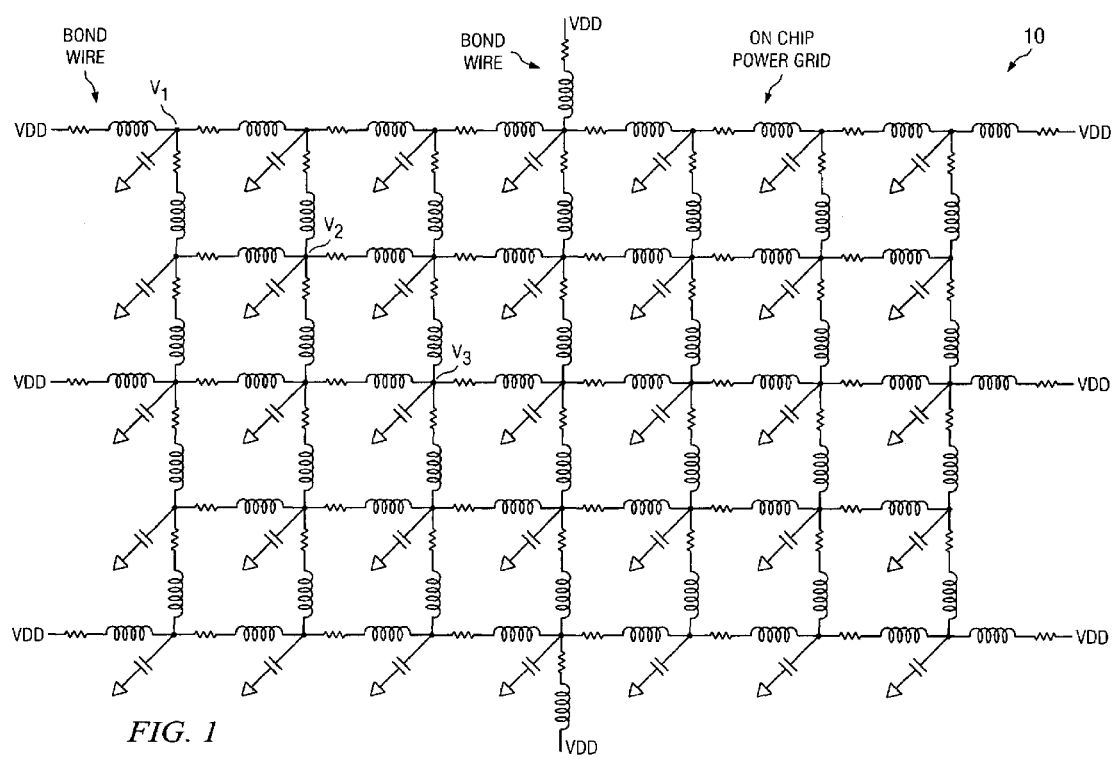
FIG. 1 is a schematic diagram illustrating a typical power grid model to determine timing closure for SoCs using voltage drop based SDFs.
Figure 2A:
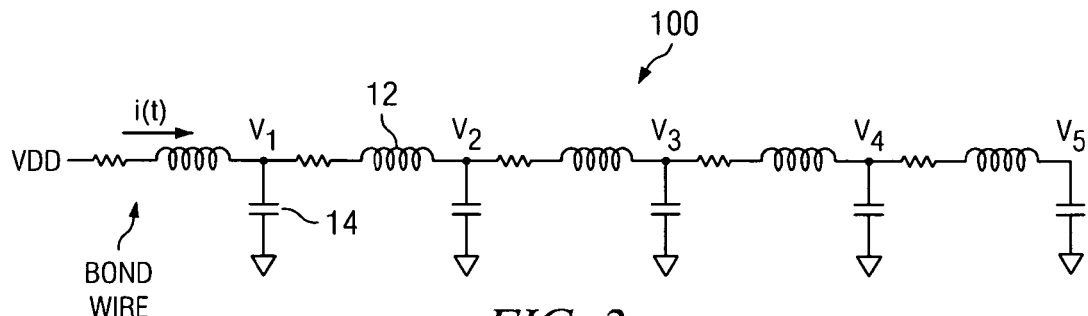
FIG. 2a is a schematic diagram illustrating one embodiment of an on chip power grid.
Figure 2B:
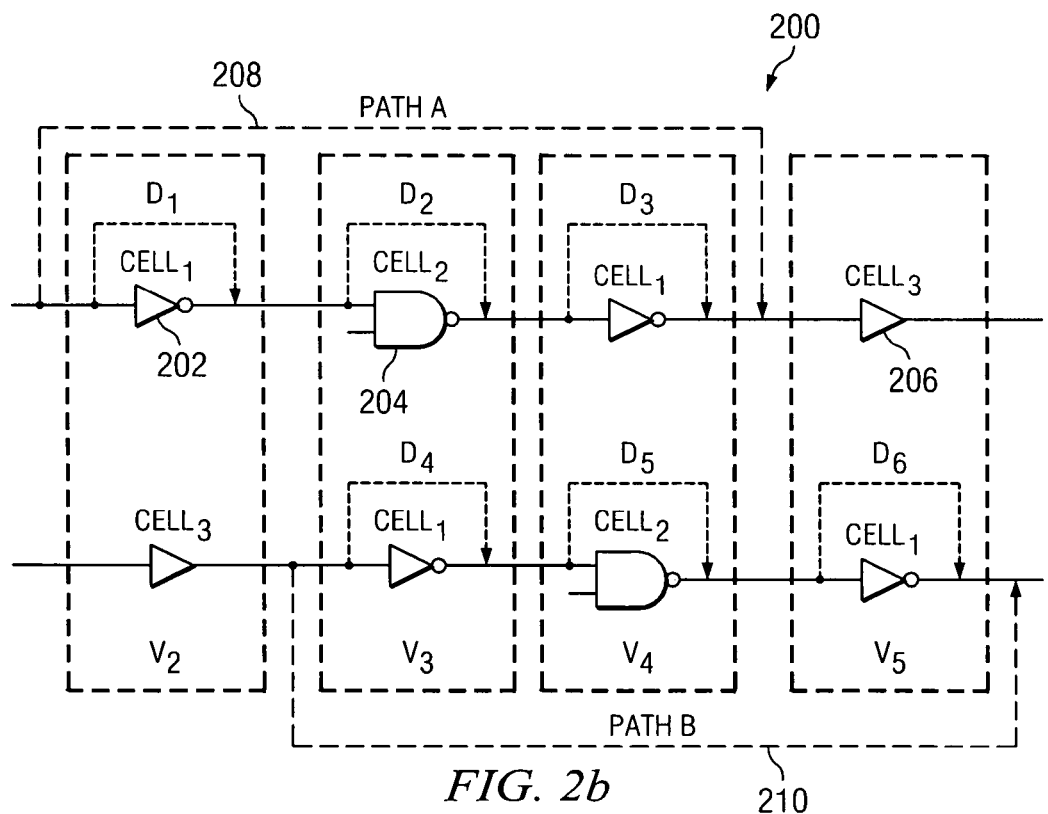
FIG. 2b is a schematic diagram depicting one embodiment for three different cells instantiated multiple times.

FIG. 1 is a schematic diagram illustrating a typical power grid model 10 to determine timing closure for SoCs using voltage drop based SDFs; while FIGS. 2a and 2b depict schematic diagrams illustrating one embodiment of an on chip power grid 100 and one embodiment for three different cells instantiated multiple times 200. Assuming that inductors 12 are shorted and that capacitors 14 are open, the power grid 10, 100 can of course, be modeled as resistors only. Such a resistive model implies that voltage drop=IR (under static conditions), and is generally computed based on average current. Comprehending inductance as other than a short implies that voltage drop=i(t)R (static)+Ldi/dt (dynamic). The particular model employed depends upon the mode of operation as well as the frequency of operation.

With continued reference now to FIG. 2a, typically VDD>$V_1$>$V_2$>$V_3$>$V_4$>$V_5$ because of voltage drop.

Moving now to FIG. 2b, consider three different cells 202, 204, 206 ($Cell_1$, $Cell_2$, $Cell_3$) instantiated multiple times 200. A different core voltage (i.e., $V_2$, $V_3$, $V_4$, $V_5$) then is seen for each cell instance, which implies a different cell delay even for similar cell loading. Typically, $D_4$>$D_1$, $D_5$>$D_2$, and $D_6$>$D_3$. Therefore, path delay $D_A$ associated with path A 208 (=$D_1$+$D_2$+$D_3$)<path delay $D_B$ associated with path B 210 (=$D_4$+$D_5$+$D_6$).

Voltage drop effects from the periphery to the center of a wire bond associated with SoCs becomes significant when dealing with integration of multi-million equivalent logic and memory cells. Increased voltage drops mean increased path delays. The percentage of path delay delta because of voltage drop is substantial. Reduced feature size, increased integration and higher clock speeds require a lower core voltage to handle thinner oxides and to reduce power dissipation. Multiple functional and test modes of operation equate to different chip activity resulting in different voltage drops form identical chip designs. A typical static analysis, as stated herein before, assumes no voltage drop, i.e., VDD=$V_1$=$V_2$=$V_3$=$V_4$=$V_5$ and $D_4$=$D_1$, $D_5$=$D_2$, $D_6$=$D_3$ and $D_A$=$D_B$ for similar cell loading.

Known preventive methods to handle voltage drop considerations described herein before include use of design margins to account for additional path delays, minimization of voltage drop by building an extra power grid, addition of decoupling capacitors for use as secondary power sources and use of flip chip packaging (expensive solution and not practical for low cost products). The entire chip (SoC) is generally designed for worst case voltage drop which is a pessimistic approach to timing analysis at the cost of performance entitlement. The foregoing known solutions adversely effects die size and cost and leave question unanswered. Some questions concern 1) whether enough design margins were provided to compensate for voltage drops associated with all modes of operation, 2) how many decoupling capacitors are sufficient, and 3) what is the best location or placement of decoupling capacitors?

The present inventors alone recognized the necessity to comprehend the impact of both dynamic voltage drop and static IR drop on path delays directed to timing closure analysis techniques associated with SoCs using voltage drop based standard delay formats (SDFs). Static timing analysis (STA) is implemented using multiple SDFs, one for each mode (ATPG Test, BIST Test, Functional) as contrasted with doing STA with only one worst-case SDF for all modes. The multiple SDFs then account for the impact of dynamic voltage drops. This approach advantageously minimizes use of design margins, minimizes die size, and generates cell delays based on actual instance voltage and mode of operation to implement a more realistic timing analysis and acquire realizable performance entitlement.

In view of the above, it can be seen the present invention presents a significant advancement in the timing closure analysis art using voltage-drop based SDFs associated with SoCs. This invention has been described in considerable detail in order to provide those skilled in the SoC arts with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A method of performing static timing analysis of system-on-a-chip (SoC) devices to improve performance of the SOC devices, comprising:
   generating a plurality of voltage-drop based standard delay formats (SDFs) associated with a plurality of SoC operational modes, comprising generating a total voltage drop value for each cell instance associated with the SoC for each operational mode, wherein the total voltage drop value for each cell instance includes a voltage drop across cell interconnect inductance;
   toggling between the SoC operational modes to select a desired operational mode;
   running a static timing analysis for the desired operational mode using its respective voltage-drop based SDF; and
   generating an improved performance SOC device using results of the static timing analysis.

2. The method according to claim 1, wherein the plurality of SoC operational modes are selected from the group consisting of Automatic Test Pattern Generation (ATPG) Test, Built-In-Self-Test (BIST) Test, and Functional Test.

3. The method according to claim 1, wherein generating a plurality of voltage-drop based standard delay formats (SDFs) associated with the plurality of SoC operational modes, further comprises generating a path delay value for each cell instance associated with the SoC for each operational mode in response to the respective total voltage drop value for each cell instance.

4. The method according to claim 1, wherein generating a total voltage drop value for each cell instance associated with the SoC for each operational mode comprises:
   generating a static voltage drop value for each cell instance;
   generating a maximum dynamic voltage drop value for each cell instance; and
   adding the static voltage drop value and the maximum dynamic voltage drop value to generate the total voltage drop at each cell instance.

5. The method according to claim 4, wherein the maximum dynamic voltage drop value is determined using a relationship defined by (Ldi/dt+i(t)R), where Ldi/dt is the voltage across cell interconnect inductance, and i(t)R is the voltage across cell interconnect resistance.

6. A method of system-on-a-chip (SoC) device static timing analysis to improve performance of the SOC device comprising generating a plurality of voltage-drop based standard delay formats (SDFs), comprising generating a total voltage drop value for each cell instance associated with the SOC for each operational mode, wherein the total voltage drop value for each cell instance includes a voltage drop across cell interconnect inductance and a voltage drop across cell interconnect resistance; toggling between the plurality of voltage-drop based (SDFs) associated with a plurality of SoC operational modes; generating a static timing analysis for each toggled operational mode using its respective voltage-drop based SDF; and generating an improved performance SOC device using the results of the static timing analysis.

7. The method according to claim 6, wherein the plurality of SoC operational modes are selected from the group consisting of Automatic Test Pattern Generation (ATPG) Test, Built-In-Self-Test (BIST) Test, and Functional Test.

8. The method according to claim 6, wherein generating the plurality of voltage-drop based SDFs further comprises generating a path delay value for each cell instance associated with the SoC for each operational mode in response to the respective total voltage drop value for each cell instance.

9. The method according to claim 6, wherein generating a total voltage drop value for each cell instance associated with the SoC for each operational mode comprises:

generating a static voltage drop value for each cell instance;

generating a maximum dynamic voltage drop value for each cell instance; and adding the static voltage drop value and the maximum dynamic voltage drop value to generate the total voltage drop at each cell instance.

10. The method according to claim 9, wherein the maximum dynamic voltage drop value is determined using a relationship defined by (Ldi/dt+i(t)R), where Ldi/dt is the voltage across cell interconnect inductance, and i(t)R is the voltage across cell interconnect resistance.

* * * * *